(12) United States Patent
Yamada

(10) Patent No.: US 10,388,309 B2
(45) Date of Patent: Aug. 20, 2019

(54) CIRCUIT MEMBER OF DISK DRIVE SUSPENSION HAVING A METAL BASE AND A SIDE PAD PORTION ELECTRICALLY INSULATED FROM THE METAL BASE

(71) Applicant: NHK SPRING CO., LTD., Yokohama-shi, Kanagawa (JP)

(72) Inventor: Yukie Yamada, Aiko-gun (JP)

(73) Assignee: NHK SPRING CO., LTD., Kanagawa (JP)

( * ) Notice: Subject to any disclaimer, the term of this patent is extended or adjusted under 35 U.S.C. 154(b) by 0 days.

(21) Appl. No.: 15/965,522

(22) Filed: Apr. 27, 2018

(65) Prior Publication Data

US 2018/0336922 A1    Nov. 22, 2018

(30) Foreign Application Priority Data

May 17, 2017  (JP) ................. 2017-098229

(51) Int. Cl.
*G11B 5/48* (2006.01)
*H05K 1/05* (2006.01)

(52) U.S. Cl.
CPC ........... *G11B 5/4853* (2013.01); *G11B 5/484* (2013.01); *G11B 5/4826* (2013.01); *H05K 1/05* (2013.01); *G11B 5/486* (2013.01)

(58) Field of Classification Search
None
See application file for complete search history.

(56) References Cited

U.S. PATENT DOCUMENTS

| 5,892,637 | A | 4/1999 | Brooks et al. |
| 7,714,233 | B2 | 5/2010 | Kawamura et al. |
| 8,003,897 | B2 | 8/2011 | Kawamura et al. |
| 8,832,935 | B2 | 9/2014 | Kawamura et al. |
| 9,368,138 | B2 | 6/2016 | Inoue et al. |
| 9,679,592 | B2 | 6/2017 | Kawao |

(Continued)

FOREIGN PATENT DOCUMENTS

| CN | 101868120 A | 10/2010 |
| CN | 104240725 A | 12/2014 |
| CN | 106531198 A | 3/2017 |

(Continued)

OTHER PUBLICATIONS

Chinese Office Action (and English language translation thereof) dated Apr. 23, 2019 issued in counterpart Chinese Application No. 201810450578.5.

*Primary Examiner* — Craig A. Renner
(74) *Attorney, Agent, or Firm* — Holtz, Holtz & Volek PC

(57) ABSTRACT

A circuit member includes a metal base, an insulating layer, a conductor, and a cover layer. A terminal portion includes a thick portion formed on a side part of the insulating layer, and an extension portion, which is a part of the conductor, overlapping the thick portion. The extension portion includes a side pad portion along a side surface of the thick portion. A side surface of the side pad portion constitutes a side pad extending in a thickness direction of the conductor. A length of the side pad in a thickness direction is greater than a thickness of the conductor. A side pad insulating portion, which is formed of a part of the thick portion, is formed between a distal end of the metal base and the side pad portion.

10 Claims, 16 Drawing Sheets

(56) References Cited

U.S. PATENT DOCUMENTS 9,761,256 B2    9/2017   Kawao
2016/0111115 A1    4/2016   Fujimura et al.

FOREIGN PATENT DOCUMENTS

| JP | H05182141 A | | 7/1993 | |
|---|---|---|---|---|
| JP | 2012221539 A | * | 11/2012 | ............... G11B 5/60 |
| JP | 2012221539 A | | 11/2012 | |
| JP | 2016015194 A | | 1/2016 | |

* cited by examiner

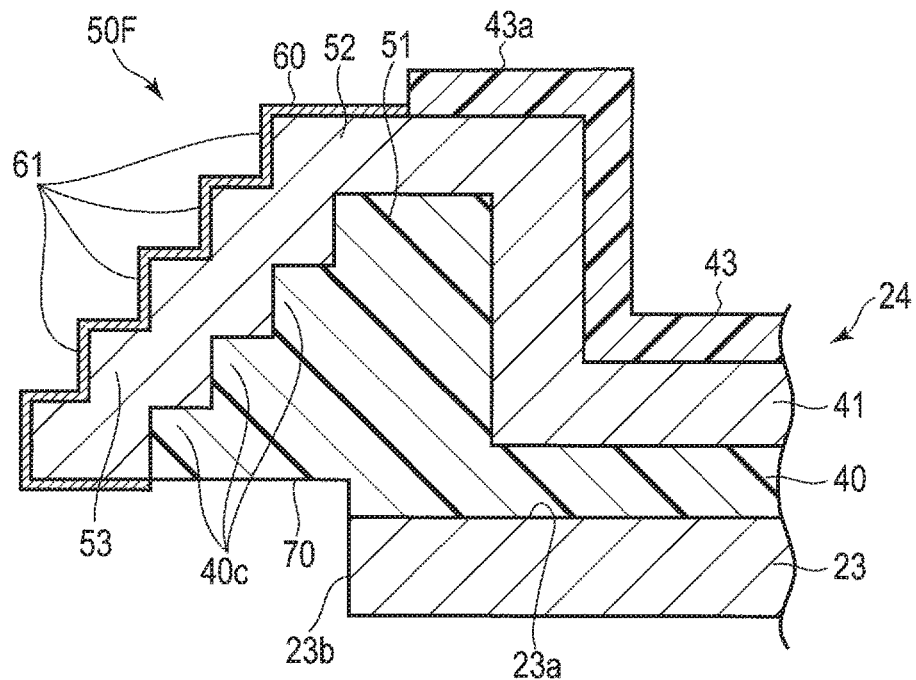
F I G. 18
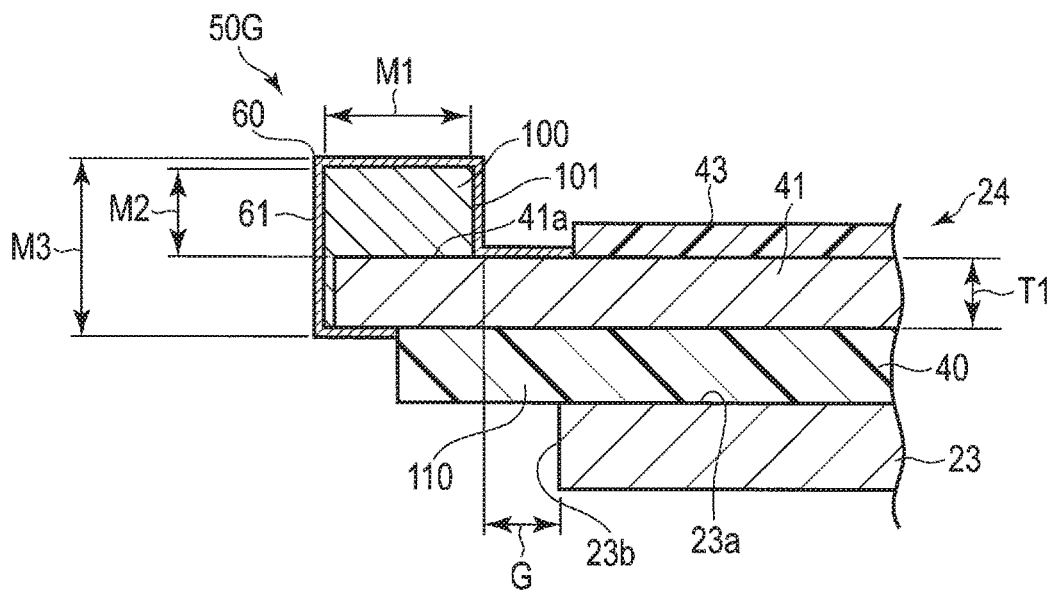
F I G. 19

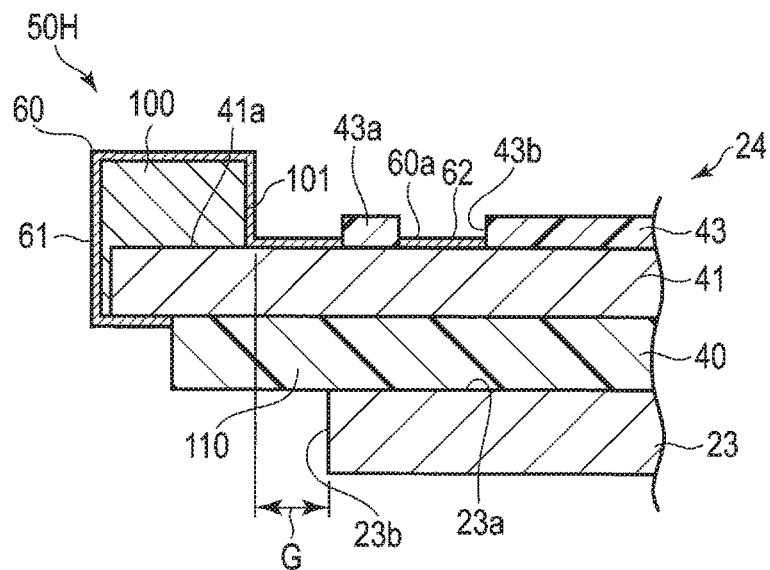
F I G. 20
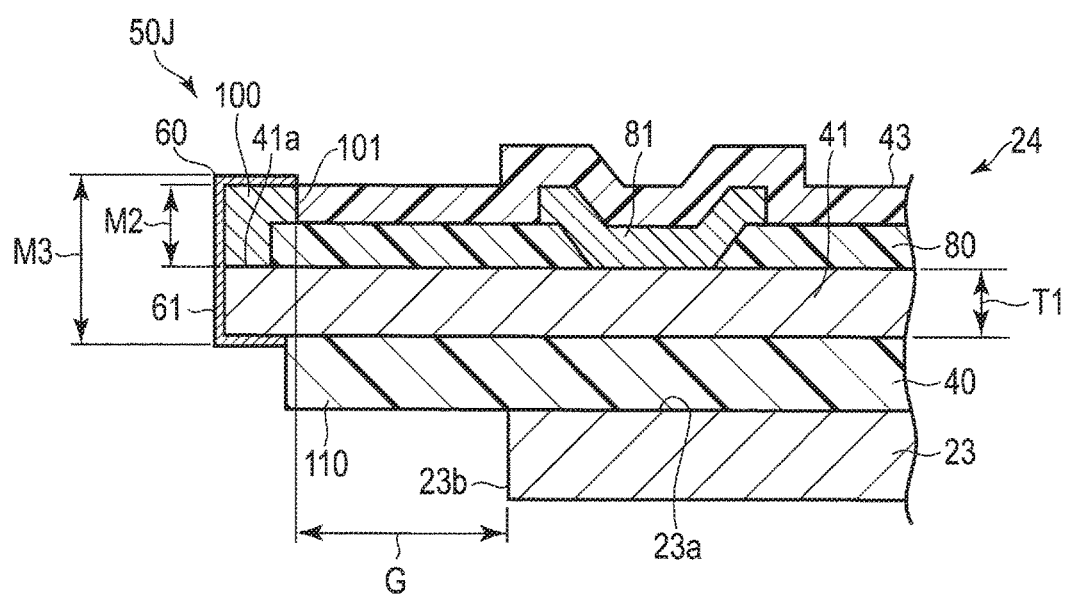
F I G. 21

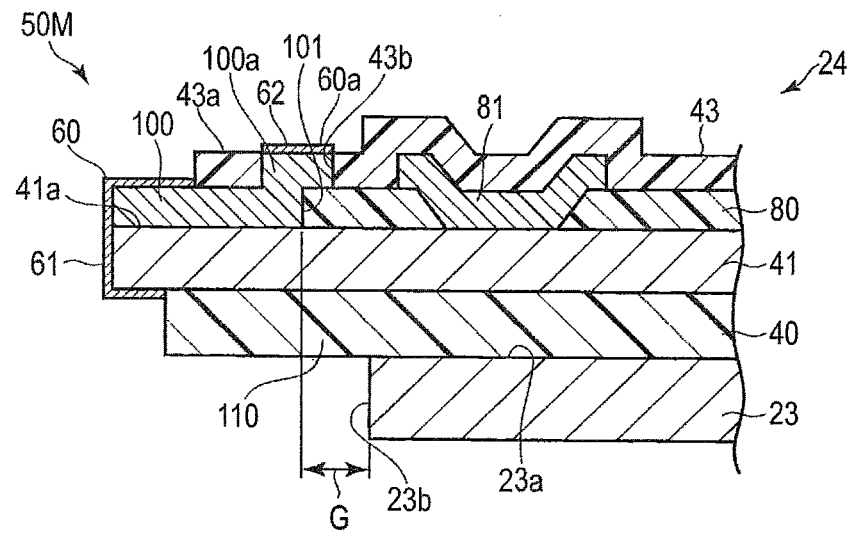
F I G. 24
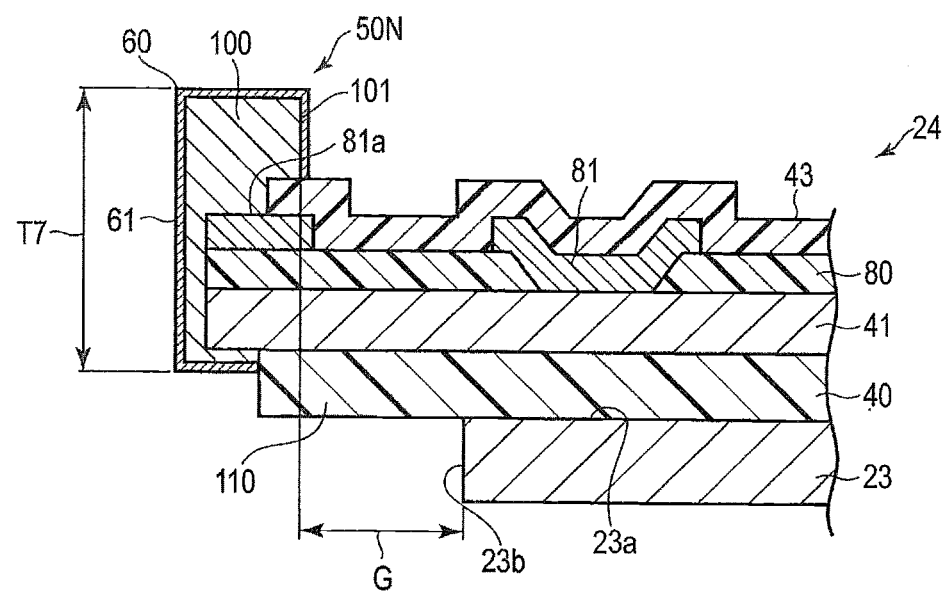
F I G. 25

CIRCUIT MEMBER OF DISK DRIVE SUSPENSION HAVING A METAL BASE AND A SIDE PAD PORTION ELECTRICALLY INSULATED FROM THE METAL BASE

CROSS-REFERENCE TO RELATED APPLICATIONS

This application is based upon and claims the benefit of priority from prior Japanese Patent Application No. 2017-098229, filed May 17, 2017, the entire contents of which are incorporated herein by reference.

BACKGROUND OF THE INVENTION

1. Field of the Invention

The present invention relates to a circuit member of a disk drive suspension, and more particularly, to a circuit member comprising a side pad.

2. Description of the Related Art

A hard disk drive (HDD) is used in an information processing apparatus such as a personal computer. The hard disk drive comprises a magnetic disk rotatable about a spindle, a carriage turnable about a pivot, etc. A disk drive suspension is provided on an arm of the carriage.

The disk drive suspension comprises elements such as a load beam, and a flexure disposed to overlap the load beam. A slider, which constitutes a magnetic head, is mounted on a tongue portion formed near a distal end of the flexure. The slider is provided with elements (transducers) for accessing data, that is, for reading or writing data. The suspension, the slider, etc., constitute a head gimbal assembly.

Various types of flexures have been put to practical use according to the required specifications. For example, a flexure with a circuit member includes a metal base, an insulating layer, and a plurality of conductors. The metal base is formed of a thin stainless steel plate. The insulating layer is formed of an electrically insulating material such as polyimide, and is formed on the metal base. The conductors are made of copper, and are formed on the insulating layer. At least a part of these conductors are connected to elements (for example, MR elements) arranged in the slider.

In accordance with a multifunction feature of the suspension, the number of conductors arranged in the flexure has been increased. As the means for connecting the conductors to terminals of an electronic component, bonding by ultrasonic induction heating, and bonding using solder are known. When the terminals are to be bonded to each other by solder, a method of bonding the terminals vertically is generally known. More specifically, a surface of one terminal is overlaid on a surface of another terminal in a thickness direction, and the two terminals are bonded to each other. On the other hand, connecting the terminals in a lateral direction of the conductors is also known. Connecting the terminals in the lateral direction has a problem in the reliability of connection because a sufficient connection area cannot be obtained due to the thinness of the conductors.

JP H05-182141 A (Patent Literature 1) and U.S. Pat. No. 5,892,637 A (Patent Literature 2) describe that a bent portion is formed at a distal end of a conductor, and the bent portion is connected to a terminal of a slider. JP 2016-15194 A (Patent Literature 3) describes that a bent portion formed at a distal end of a conductor is connected to a terminal of a heat assist element. JP 2012-221539 A (Patent Literature 4) describes that a height adjustment plating portion is formed by plating at a distal end of a conductor, and the height adjustment plating portion is connected to a terminal of a slider.

In a connection portion of Patent Literatures 1, 2, and 3, the bent portion is formed at an end portion of the conductor, and the bent portion is connected to the terminal. However, if the form accuracy of the bent portion is not good, connection with an electronic component may be defective. Moreover, there is a problem that forming a bent portion at an end portion of a small conductor accurately is technically difficult, and is troublesome. In a connection portion described in Patent Literature 4, the height adjustment plating portion is provided at a distal end of the conductor. A distal end of a metal base extends to a point near the height adjustment plating portion. Accordingly, when a bonding method of spraying molten solder on a bonding portion (solder jet bonding) is adopted, part of the solder may adhere to a metal support substrate. If the solder adheres to the metal support substrate, it is feared that the adhesion may be a cause of electrical short-circuit such as a solder bridge.

BRIEF SUMMARY OF THE INVENTION

An object of the present invention is to provide a circuit member of a disk drive suspension comprising a side pad which has a large connection area, and which can prevent a conductive bonding material such as solder from adhering to a metal base.

Examples of a circuit member according to one embodiment are shown in any of FIGS. 8 to 18. The circuit member includes a metal base, an insulating layer, a conductor, a cover layer, and a terminal portion. The metal base is made of stainless steel, for example. The insulating layer is formed of an electrically insulating material such as polyimide, and is formed on the metal base. The conductor is formed on the insulating layer. The cover layer is formed of an electrically insulating material, and covers the conductor. The terminal portion comprises a thick portion, an extension portion of the conductor, a side pad portion, and a side pad insulating portion. The thick portion is formed on a side part of the insulating layer. The extension portion overlaps the thick portion. The side pad portion is a part of the extension portion, and extends in a thickness direction of the conductor along a side surface of the thick portion. The side pad insulating portion is formed of a part of the thick portion, and electrically insulates a distal end of the metal base from the side pad portion.

According to the circuit member of the present embodiment, connection with an electronic component can be achieved via a side pad having a large connection area. Moreover, it is possible to prevent a conductive bonding material such as solder supplied to the side pad from adhering to the metal base by the side pad insulating portion. Also, since the side pad is provided in the terminal portion, more conductive lines can be connected to the terminal portion of a limited small space, and the density of terminals can be improved.

Examples of a circuit member according to the other embodiments are shown in any of FIGS. 19 to 29. The circuit member includes a metal base, an insulating layer formed on the metal base, a conductor formed on the insulating layer, a cover layer, which is formed of an electrically insulating material, covering the conductor, and a terminal portion. The terminal portion comprises a side pad member, and a side pad insulating portion. The side pad member is disposed on a surface of an end portion of the conductor, and extends in a thickness direction of the conductor. The side pad insulating portion is formed of a part of the insulating layer, and electrically insulates a distal end of the metal base from the side pad member. The side pad member is formed into a predetermined thickness by nickel plating, for example. The thickness of the side pad member can be changed by the specifications of a plating process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 18 is a cross-sectional view of a terminal portion according to a tenth embodiment.

FIG. 19 is a cross-sectional view of a terminal portion according to an eleventh embodiment.

FIG. 20 is a cross-sectional view of a terminal portion according to a twelfth embodiment.

FIG. 21 is a cross-sectional view of a terminal portion according to a thirteenth embodiment.

FIG. 24 is a cross-sectional view of a terminal portion according to a sixteenth embodiment.

FIG. 25 as a cross-sectional view of a terminal portion according to a seventeenth embodiment.

DETAILED DESCRIPTION OF THE INVENTION

A circuit member of a disk drive suspension according to a first embodiment will be hereinafter described with reference to FIGS. 1 to 9.

Figure 1:
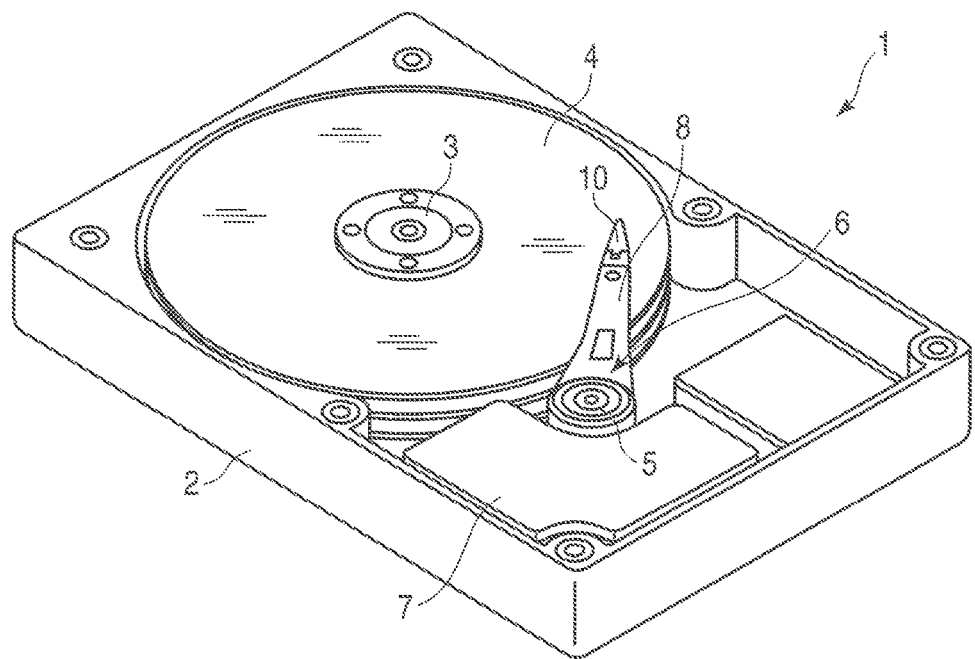
FIG. 1 is a perspective view showing an example of a disk drive.

A disk drive (HDD) 1 shown in FIG. 1 comprises a case 2, disks 4 rotatable about a spindle 3, a carriage 6 which turns about a pivot 5, and a positioning motor 7 for turning the carriage 6. The case 2 is sealed by a lid which is not shown.

Figure 2:
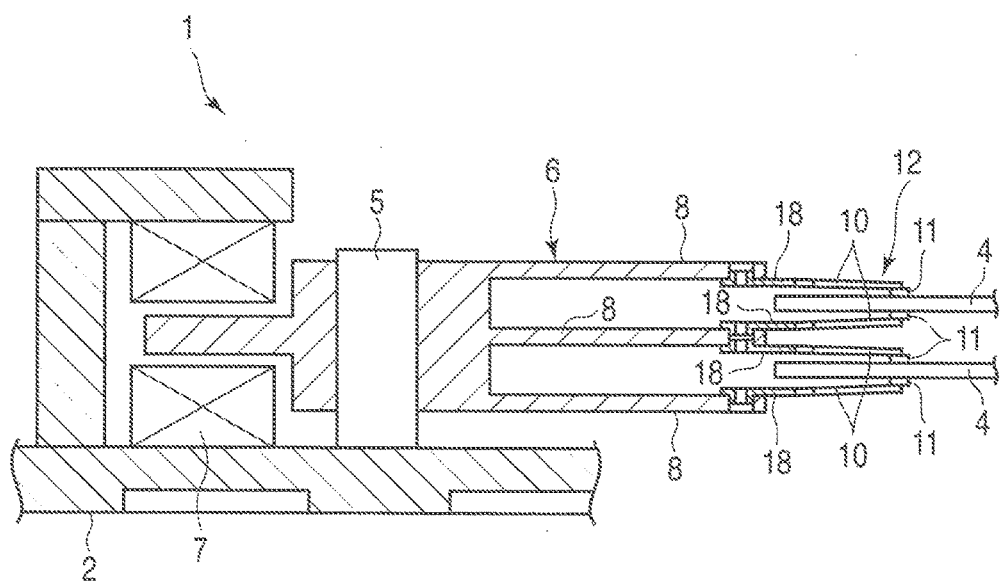
FIG. 2 is a cross-sectional view showing a part of the disk drive shown in FIG. 1.

FIG. 2 is a cross-sectional view schematically showing a part of the disk drive 1. The carriage 6 is provided with arms 8. At a distal end portion of each arm 8, a disk drive suspension (hereinafter simply referred to as a suspension) 10 is mounted. A slider 11 which constitutes a magnetic head is provided at a distal end portion of the suspension 10. As each disk 4 rotates at high speed, an air bearing is formed between the disk 4 and the slider 11. If the carriage 6 is turned by the positioning motor 7, the suspension 10 moves radially relative to the disk 4. In this way, the slider 11 moves to a desired track of the disk 4. The suspension 10 and the slider 11 constitute an HGA (head gimbal assembly) 12.

Figure 3:
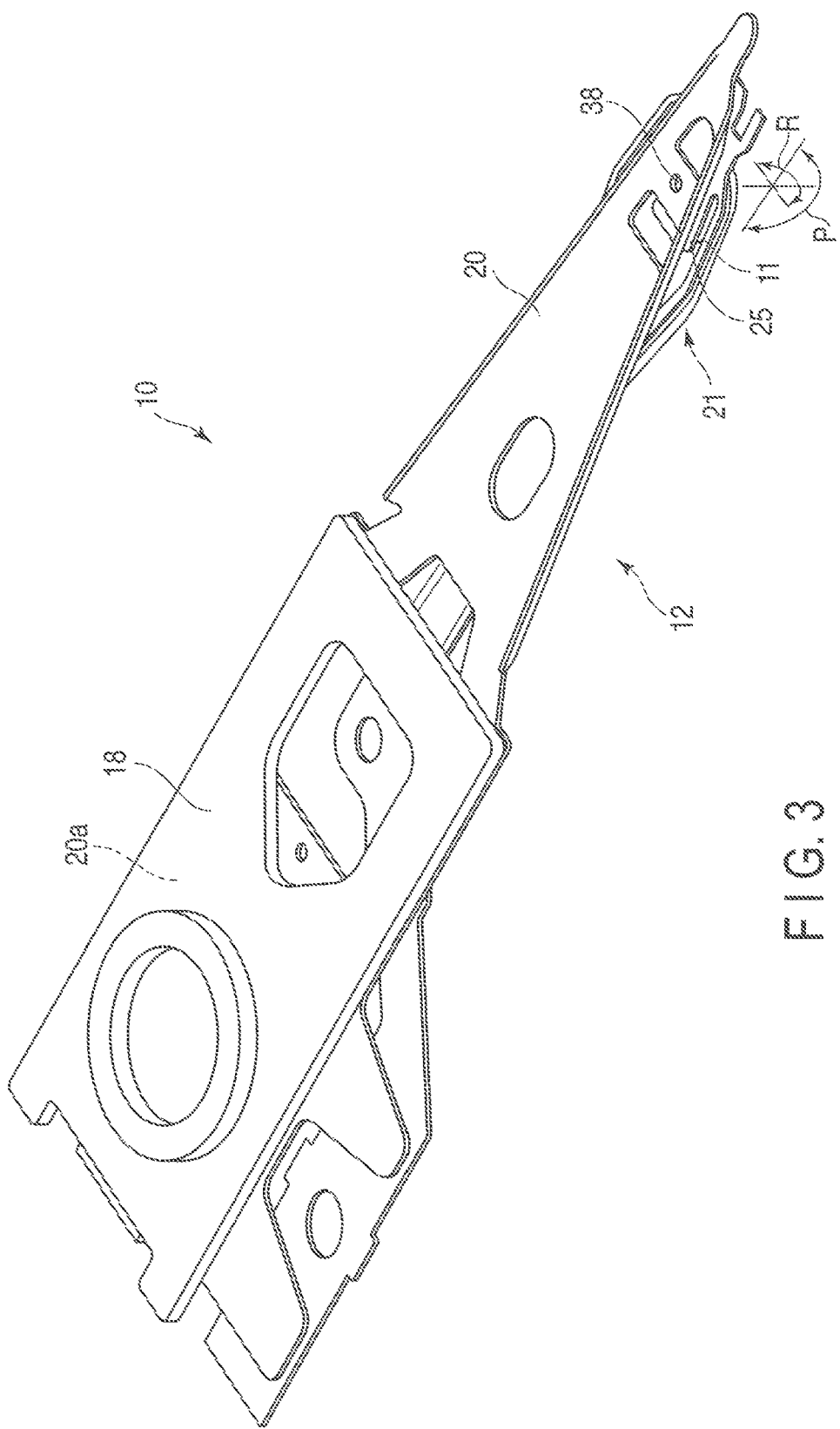
FIG. 3 is a perspective view showing an example of a suspension of the disk drive.

FIG. 3 shows an example of the head gimbal assembly 12. The suspension 10 is a constituent element of the head gimbal assembly 12. The suspension 10 comprises a baseplate 18, a load beam 20, a flexure 21 with a circuit member, etc. The flexure 21 is provided along a longitudinal direction of the load beam 20. A proximal portion 20a of the load beam 20 overlaps the baseplate 18. The load beam 20 is secured to the arm 8 (FIGS. 1 and 2) via the baseplate 18.

Figure 4:
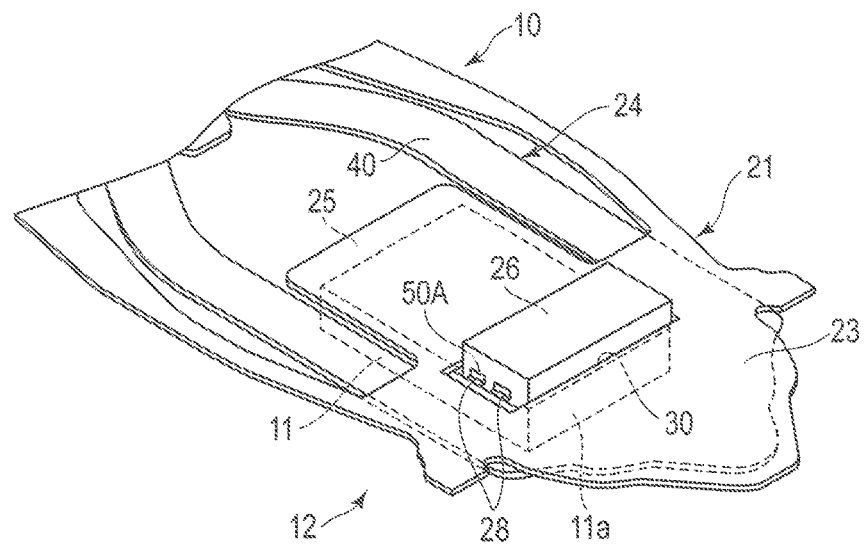
FIG. 4 is a perspective view showing a part of the suspension comprising a circuit member and an electronic component according to a first embodiment.
Figure 5:
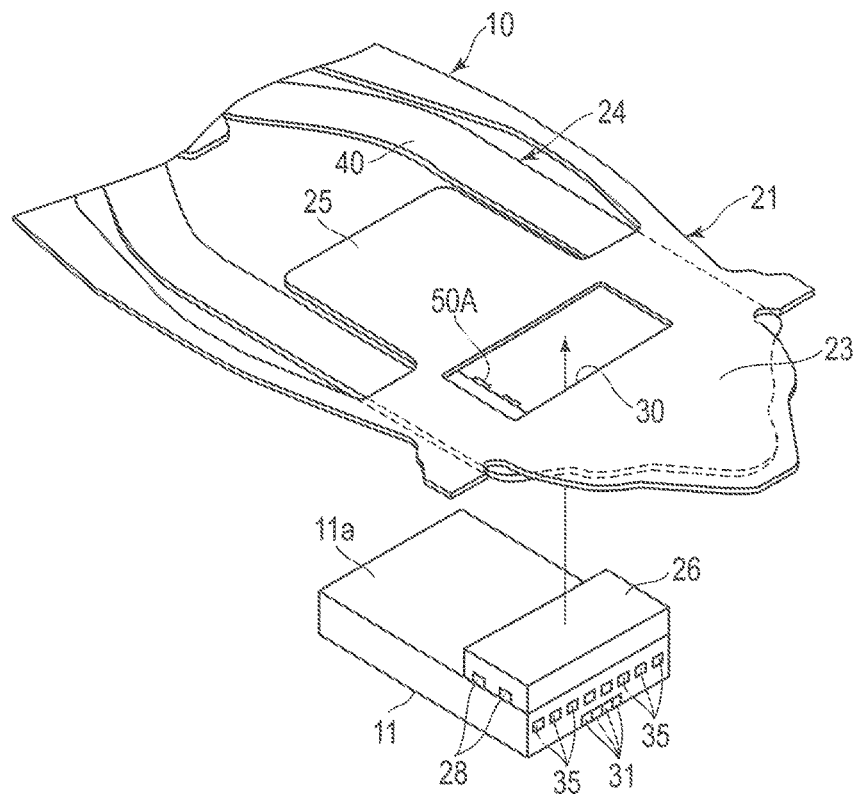
FIG. 5 is an exploded perspective view of the part of the suspension and the electronic component shown in FIG. 4.
Figure 6:
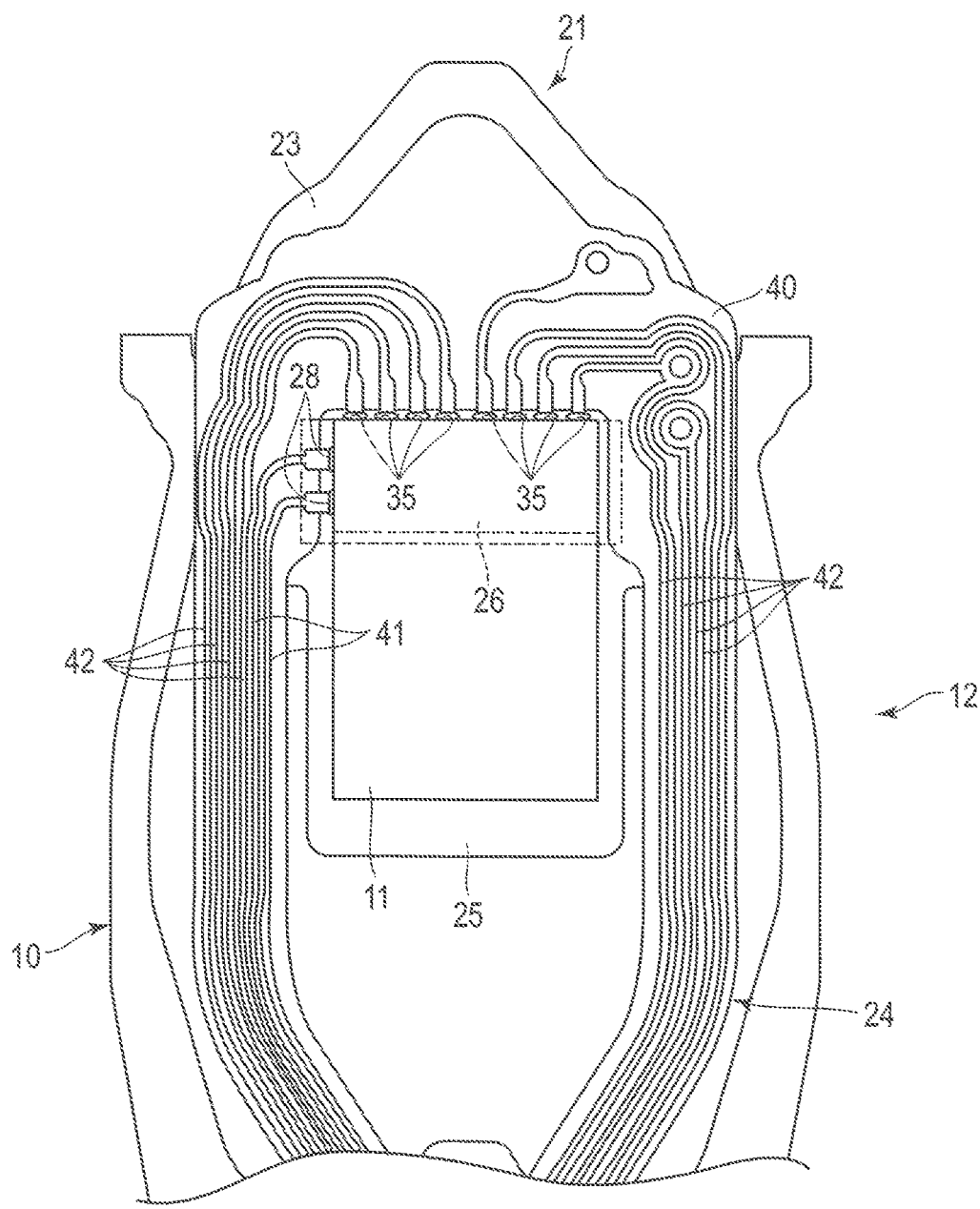
FIG. 6 is a plan view of the part of the suspension and the electronic component shown in FIG. 4.
Figure 7:
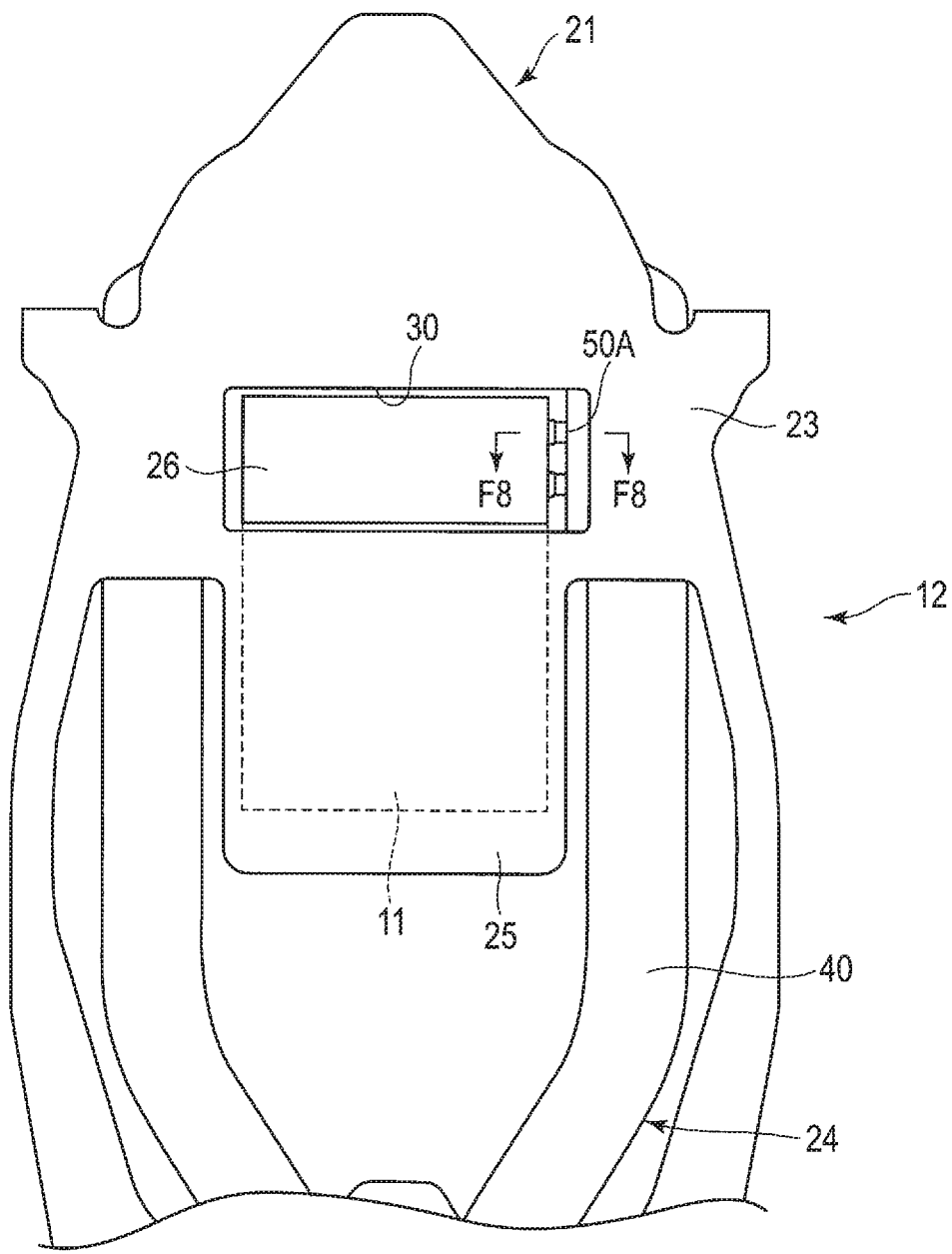
FIG. 7 is a bottom view of the part of the suspension and the electronic component shown in FIG. 6 as seen from the opposite side.

FIG. 4 shows the distal end portion of the suspension 10 and the slider 11. FIG. 5 is a perspective view of a state in which the suspension 10 and the slider 11 are separated from each other. FIG. 6 is a plan view of the distal end portion of the suspension 10 and the slider 11 as seen from one side, and FIG. 7 is a bottom view of the distal end portion of the suspension 10 and the slider 11 as seen from the opposite side.

The flexure 21 includes a metal base 23, and a circuit member 24. The metal base 23 is formed of a stainless-steel plate which is thinner than the load beam 20. The circuit member 24 is formed along the metal base 23. As shown in FIG. 6, the circuit member 24 is disposed along the metal base 23, and extends in a longitudinal direction of the metal base 23.

The metal base 23 is formed in a shape having a predetermined contour by etching the stainless-steel plate. The metal base 23 is secured to the load beam 20 by laser welding, etc. A tongue portion 25 is formed at a part of the metal base 23. The slider 11 is mounted on the tongue portion 25. The tongue portion 25 can be deformed elastically in a thickness direction of the metal base 23.

An example of the slider 11 includes a slider main body 11a and an electronic component 26. An example of the electronic component 26 is a heat assist device. However, the other electronic components may be applied according to the purpose. Terminals 28 are provided on a side surface of the electronic component 26. An opening 30 for inserting the electronic component 26 is formed in the metal base 23.

At an end portion of the slider main body 11a, elements 31 for recording and reproduction (schematically illustrated in FIG. 5), such as MR elements, are arranged. By these elements 31, access such as writing or reading of data on and from a recording surface of the disk 4 is performed. A plurality of terminals 35 are provided on an end face of the slider main body 11a.

A dimple 38 (FIG. 3) is formed near a distal end of the load beam 20. As a distal end of a surface on a convex side of the dimple 38 contacts the tongue portion 25, the tongue portion 25 is swingably supported. The tongue portion 25 can be swung in a rolling direction R and a pitching direction P.

Figure 8:
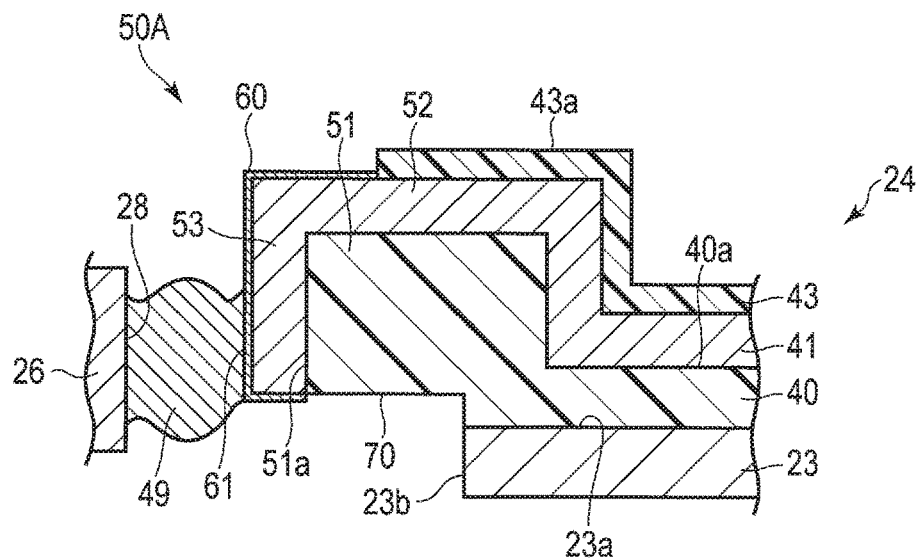
FIG. 8 is a cross-sectional view schematically showing a connection portion of the circuit member taken along line F8-F8 of FIG. 7.

FIG. 8 is a cross-sectional view taken along line F8-F8 of FIG. 7. FIG. 8 schematically illustrates a part of the circuit member 24. The circuit member 24 includes an insulating layer 40, a pair of conductors 41, a plurality of conductors 42 (FIG. 6), and a cover layer 43. The insulating layer 40 is formed along a surface 23a, on one side, of the metal base 23. The two conductors 41 are connected to the terminals 28 of the electronic component 26, respectively. The plurality of conductors 42 are connected to the terminals 35 of the slider 11, respectively. The cover layer 43 covers the conductors 41 and 42. The terminals 28 of the electronic component 26 are connected to a terminal portion 50A of the circuit member 24 via a conductive bonding material 49. The conductive bonding material 49 is formed of a conductive material such as solder.

Figure 9:
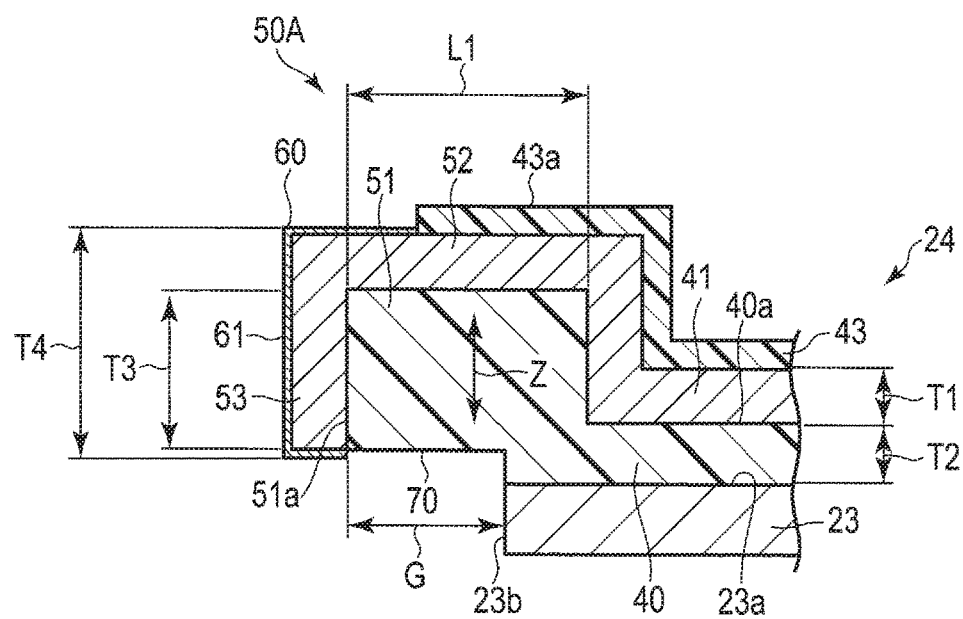
FIG. 9 is a cross-sectional view of a terminal portion of the circuit member shown in FIG. 8.

FIG. 9 schematically represents a cross section of the terminal portion 50A. Arrow Z in FIG. 9 indicates a thickness direction of the circuit member 24 (a thickness direction of the conductor 41). The conductor 41 is made of copper. The conductor 41 is formed along a surface 40a, on one side, of the insulating layer 40 by a plating process. An example of a thickness T1 (FIG. 9) of each of the conductors 41 is 10 µm. The insulating layer 40 and the cover layer 43 are formed of an electrically insulating material such as polyimide. A thickness T2 of the insulating layer 40 is, for example, 10 µm.

The terminal portion 50A includes a thick portion 51, an extension portion 52, which is a part of the conductor 41, and an extension portion 43a of the cover layer 43. The thick portion 51 is formed on a side part of the insulating layer 40 (base polyimide). The extension portion 52 covers a part of the thick portion 51. The thick portion 51 is formed for a length L1 (FIG. 9) on the side part of the insulating layer 40. A thickness T3 of the thick portion 51 is, for example, 20 to 100 µm. The thickness T3 of the thick portion 51 is greater than the thickness T2 of the insulating layer 40 excluding the thick portion 51.

A side pad portion 53 is formed on a distal end side of the extension portion 52 of the conductor 41 (a side surface of the circuit member 24). The side pad portion 53 is formed integrally with the extension portion 52 of the conductor 41 by the plating process. The side pad portion 53 extends in a thickness direction of the conductor 41 (i.e., the direction indicated by arrow Z in FIG. 9) along a side surface 51a of the thick portion 51. The side pad portion 53 is covered with a gold-plated layer 60.

An example of the gold-plated layer 60 includes a base nickel layer having a thickness of 0.12 to 2.0 µm, and gold plating having a thickness of 0.5 to 1.5 µm formed on the base nickel layer. The gold-plated layer 60 prevents oxidization of the side pad portion 53, and reduces the electrical resistance of the side pad portion 53.

An end face of the side pad portion 53 constitutes a side pad 61 for establishing electrical connection with the electronic component 26. As shown in FIG. 8, the side pad portion 53 is electrically connected to the terminal 28 of the electronic component 26 via the conductive bonding material 49. An example of the conductive bonding material 49 is solder supplied between the side pad 61 and the terminal 28.

In FIG. 9, T1 represents the thickness of the conductor 41. T4 is a length of the side pad 61 in the thickness direction. T4 is sufficiently greater than T1. The side pad 61 extends in the thickness direction of the conductor 41 (i.e., a thickness direction of the thick portion 51) along the side surface 51a of the thick portion 51. The thickness T1 of the conductor 41 is so small as 10 µm, for example. However, the length T4 of the side pad 61 in the thickness direction is sufficiently large (for example, 50 µm or more) to achieve connection with the electronic component 26. Accordingly, a large connection area can be secured. For this reason, poor connection can be prevented, and combining a conventional pad (vertical bonding) with a side pad is also enabled.

Further, the terminal portion 50A includes a side pad insulating portion 70 which is formed of a part of the thick portion 51. The side pad insulating portion 70 extends for an insulating distance G (FIG. 9) from a distal end 23b of the metal base 23. By the side pad insulating portion 70, the insulating distance G necessary for electrical insulation is secured between the side pad portion 53 and the distal end 23b of the metal base 23. As appropriate insulating distance G is secured, it has become possible to avoid a cause of electrical short-circuit such as a solder bridge. Moreover, since the thick portion 51 is provided, the strength of the terminal portion 50A can be increased.

Figure 10:
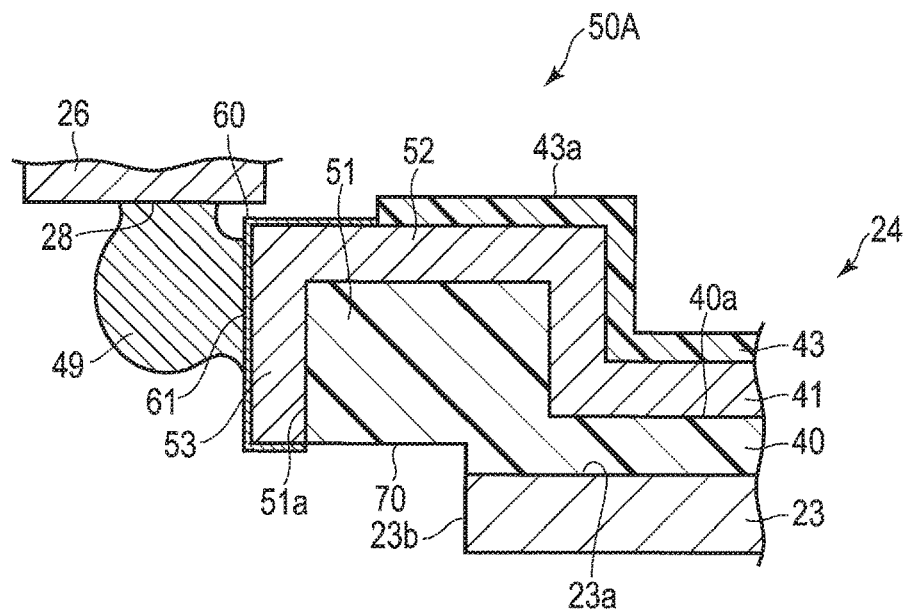
FIG. 10 is a cross-sectional view of a connection portion between a terminal portion and an electronic component according to a second embodiment.

FIG. 10 shows a connection portion between a terminal portion 50A and an electronic component 26 according to a second embodiment. The structure of the terminal portion 50A has commonality with the embodiment shown in FIG. 9. A terminal 28 is provided on a lower surface side of the electronic component 26. In alignment of the connecting position shown in FIG. 10, the terminal 28 and a side pad 61 are electrically connected to each other via a conductive bonding material 49.

Figure 11:
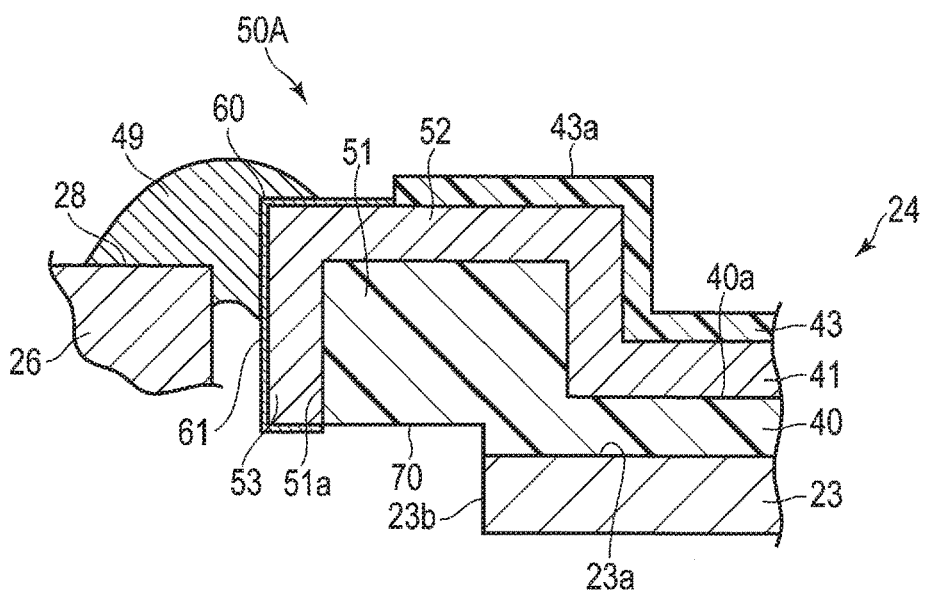
FIG. 11 is a cross-sectional view of a connection portion between a terminal portion and an electronic component according to a third embodiment.

FIG. 11 shows a connection portion between a terminal portion 50A and an electronic component 26 according to a third embodiment. The structure of the terminal portion 50A has commonality with the embodiment shown in FIG. 9. A terminal 28 is provided on an upper surface side of the electronic component 26. In alignment of the connecting position shown in FIG. 11, the terminal 28 and an upper part of a side pad 61 are electrically connected to each other via a conductive bonding material 49.

Figure 12:
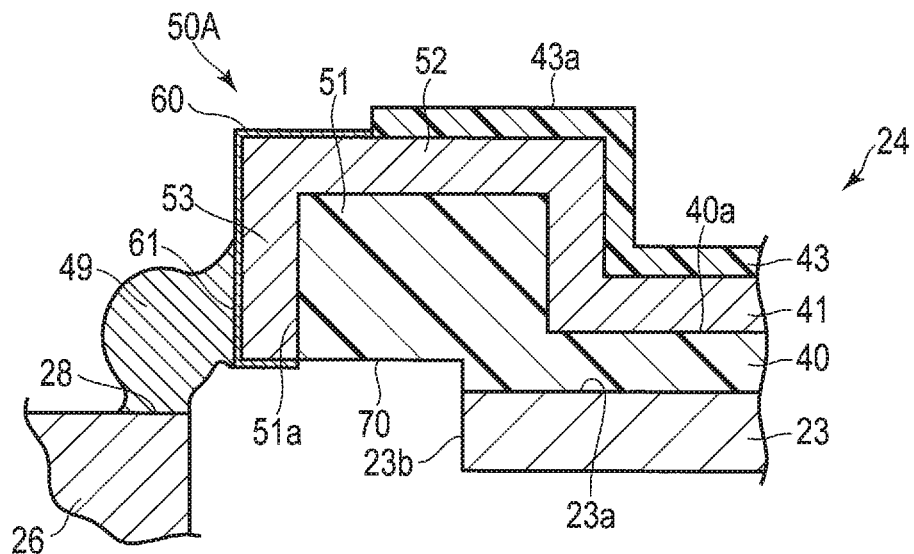
FIG. 12 is a cross-sectional view of a connection portion between a terminal portion and an electronic component according to a fourth embodiment.

FIG. 12 shows a connection portion between a terminal portion 50A and an electronic component 26 according to a fourth embodiment. The structure of the terminal portion 50A has commonality with the embodiment shown in FIG. 9. A terminal 28 is provided on an upper surface side of the electronic component 26. In alignment of the connecting position shown in FIG. 12, the terminal 28 and a lower part of a side pad 61 are electrically connected to each other via a conductive bonding material 49. As can be understood from these embodiments, the alignment of the connecting position can be selected according to a position relative to the electronic component 26. Accordingly, there is an advantage of having great flexibility in selection regarding connection.

Figure 13:
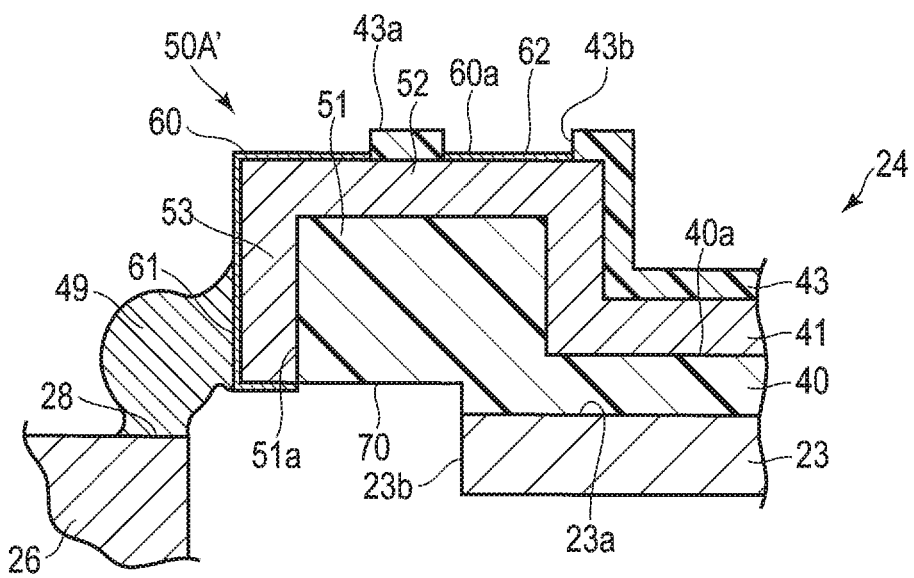
FIG. 13 is a cross-sectional view of a terminal portion according to a fifth embodiment.

FIG. 13 shows a terminal portion 50A' according to a fifth embodiment. An opening 43b is formed in a cover layer 43 covering a thick portion 51. An upper pad 62 is formed inside the opening 43b. The upper pad 62 is covered with a gold-plated layer 60a. According to the terminal portion 50A' of the present embodiment, a side pad 61 can be connected to an electronic component or the upper pad 62 can be connected to the electronic component. Since the other structures have commonality with the terminal portion 50A shown in FIG. 12, common reference numbers are assigned to parts that are common to the two and explanations of such parts will be omitted.

Figure 14:
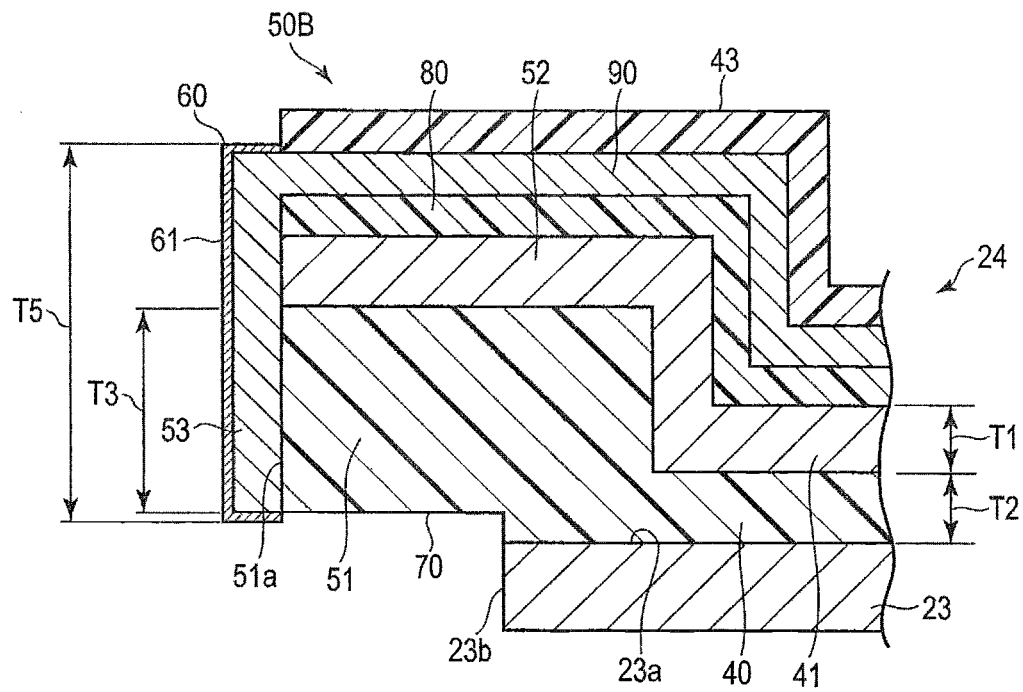
FIG. 14 is a cross-sectional view of a terminal portion according to a sixth embodiment.

FIG. 14 shows a terminal portion 50B according to a sixth embodiment. The terminal portion 50B includes a thick portion 51, an extension portion 52 of a first conductor 41, an intermediate insulating layer 80, a second conductor 90, and a cover layer 43. The thick portion 51 is formed on a side part of an insulating layer 40 (base polyimide). The extension portion 52 overlaps the thick portion 51. The intermediate insulating layer 80 overlaps the extension portion 52. The second conductor 90 overlaps the intermediate insulating layer 80. At a distal end side of the second conductor 90, a side pad portion 53 is formed. The side pad portion 53 extends in a thickness direction of the conductors 41 and 90 along a side surface 51a of the thick portion 51.

The first conductor 41 and the second conductor 90 are electrically short-circuited with each other via the side pad portion 53. A thickness T3 of the thick portion 51 is greater than a thickness T2 of the insulating layer 40 excluding the thick portion 51. The side pad portion 53 is covered with a gold-plated layer 60. A side pad 61 is formed on a side surface of the side pad portion 53. The side pad 61 extends in a thickness direction of the conductors 41 and 90. A length T5 of the side pad 61 is sufficiently greater than a thickness T1 of the conductor 41. Accordingly, a large connection area is secured. Since the other structures have commonality with the terminal portion 50A shown in FIG. 9, common reference numbers are assigned to parts that are common to the two and explanations of such parts will be omitted.

In the terminal portion 50B shown in FIG. 14, the first conductor 41 and the second conductor 90 are stacked in the thickness direction with the intermediate insulating layer 80 interposed therebetween. Such a stacked structure can be applied to an interleaved circuit. With respect to the terminal portion 50B of the present embodiment, a distal end of the first conductor 41 and a distal end of the second conductor 90 are electrically short-circuited (electrically connected) with each other via the side pad portion 61 in the interleaved circuit. According to a short-circuit structure using the side pad 61, as compared to a case of short-circuiting a certain point in the middle of the conductors 41 and 90 in a longitudinal direction thereof via a via portion, the interleaved circuit can be made longer. Accordingly, the electrical properties can be improved. With respect to this point, a similar advantage can be expected from terminal portions 50C, 50D, and 50E shown in FIGS. 15, 16, and 17, which will be described below.

Figure 15:
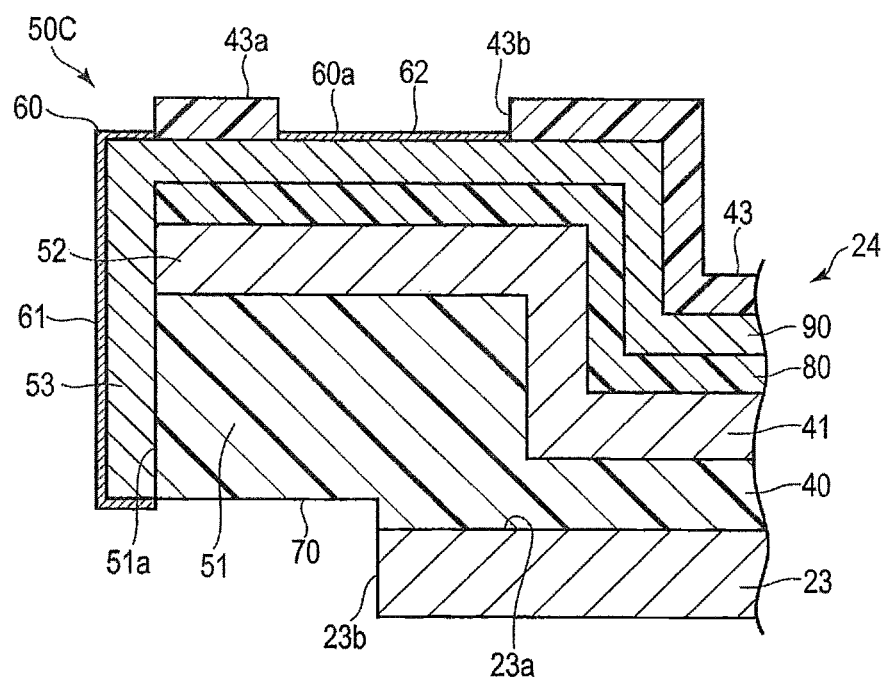
FIG. 15 is a cross-sectional view of a terminal portion according to a seventh embodiment.

FIG. 15 illustrates a terminal portion 50C according to a seventh embodiment. An opening 43b is formed in a cover layer 43 in the vicinity of a side pad 61. An upper pad 62 is formed inside the opening 43b. The upper pad 62 is covered with a gold-plated layer 60a. According to the terminal portion 50C of the present embodiment, the side pad 61 can be connected to an electronic component or the upper pad 62 can be connected to the electronic component. Since the other structures have commonality with the terminal portion 50B shown in FIG. 14, common reference numbers are assigned to parts that are common to the two and explanations of such parts will be omitted.

Figure 16:
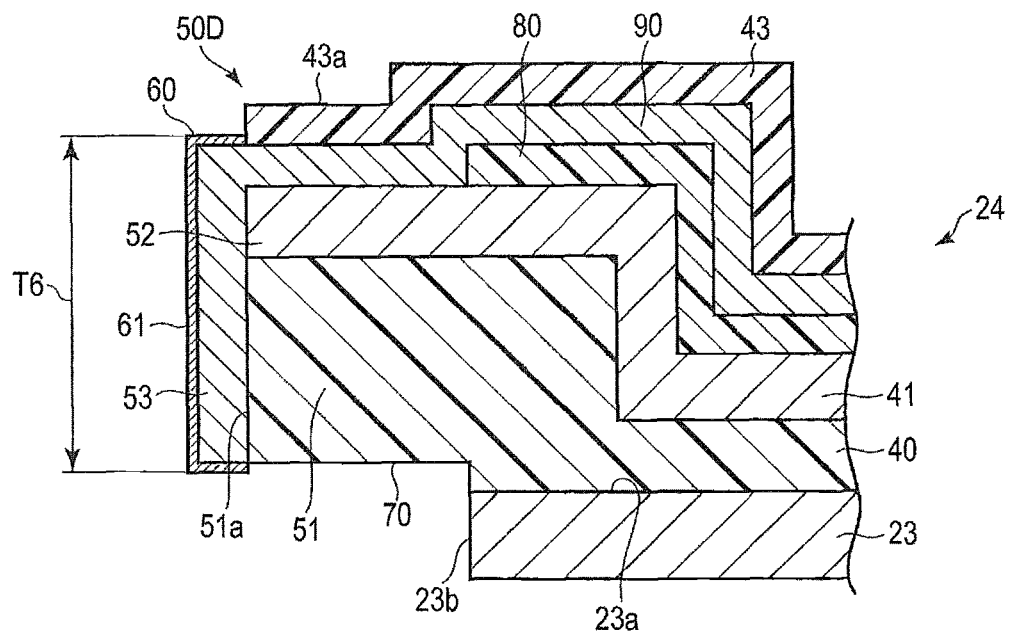
FIG. 16 is a cross-sectional view of a terminal portion according to an eighth embodiment.

FIG. 16 illustrates a terminal portion 50D according to an eighth embodiment. Likewise the terminal portion 50B shown in FIG. 14, the terminal portion 50D includes a thick portion 51, an extension portion 52 of a first conductor 41, an intermediate insulating layer 80, a second conductor 90, and a cover layer 43. The thick portion 51 is formed on a side part of an insulating layer 40 (base polyimide). The extension portion 52 is along the thick portion 51. The intermediate insulating layer 80 overlaps the first conductor 41. The second conductor 90 overlaps the intermediate insulating layer 80. The second conductor 90 is electrically connected to the extension portion 52 of the first conductor 41.

A side pad portion 53 is formed at a distal end of the second conductor 90. The side pad portion 53 is electrically connected to the extension portion 52 of the first conductor 41 and the second conductor 90. The side pad portion 53 extends in a thickness direction of the conductor 41 along an end face of the thick portion 51 and an end face of the extension portion 52. At a side surface of the side pad portion 53, a side pad 61 covered with a gold-plated layer 60 is formed. The side pad 61 is covered with the gold-plated layer 60. Also in the terminal portion 50D of the present embodiment, a length T6 of the side pad 61 can be made sufficiently large, and a large connection area can be secured. Since the other structures have commonality with the terminal portion 50B shown in FIG. 14, common reference numbers are assigned to parts that are common to the two and explanations of such parts will be omitted.

Figure 17:
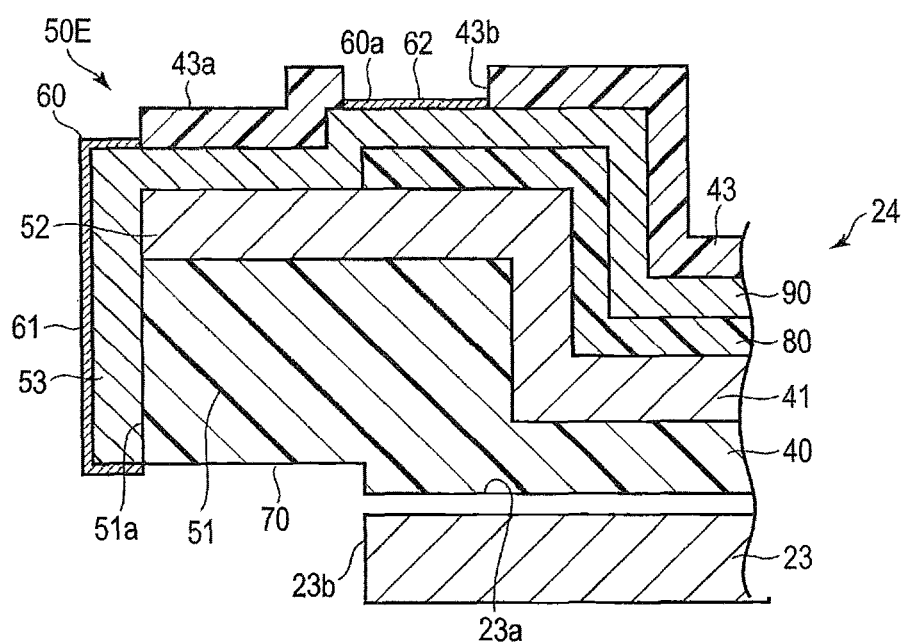
FIG. 17 is a cross-sectional view of a terminal portion according to a ninth embodiment.

FIG. 17 illustrates a terminal portion 50E according to a ninth embodiment. An opening 43b is formed in a cover layer 43 in the vicinity of a side pad 61. An upper pad 62 is formed inside the opening 43b. The upper pad 62 is covered with a gold-plated layer 60a. According to the terminal portion 50E, the side pad 61 can be connected to an electronic component or the upper pad 62 can be connected to the electronic component. Since the other structures have commonality with the terminal portion 50D shown in FIG. 16, common reference numbers are assigned to parts that are common to the two and explanations of such parts will be omitted.

FIG. 18 illustrates a terminal portion 50F according to a tenth embodiment. A thick portion 51 is provided on a side part of an insulating layer 40. The thick portion 51 includes a plurality of step portions 40c which form a stair-like configuration in which the height is gradually reduced toward an outer side. A side pad portion 53 and a side pad 61 having a stair-like configuration are formed along these step portions 40c. Since the other structures have commonality with the terminal portion 50A shown in FIG. 9, common reference numbers are assigned to parts that are common to the two and explanations of such parts will be omitted.

FIG. 19 illustrates a terminal portion 50G according to an eleventh embodiment. The terminal portion 50G includes a side pad member 100. The side pad member 100 is formed on a surface 41a at an end portion of a conductor 41. The side pad member 100 is formed for a length M1 by a plating process. The side pad member 100 is made of metal (for example, nickel), and is covered with a gold-plated layer 60. A thickness M2 of the side pad member 100 is, for example, 20 to 100 µm. The thickness M2 of the side pad member 100 is greater than a thickness T1 (for example, 10 µm) of the conductor 41. The thickness M2 of the side pad member 100 can be adjusted according to the specifications of the plating process.

In the terminal portion 50G according to the present embodiment, the side pad member 100 is arranged on the surface 41a at a distal end of the conductor 41. By this feature, a side pad 61 having a length M3 (for example, 20 µm or more) in a thickness direction of the conductor 41 can be provided. Although the thickness T1 of the conductor 41 is small, a connection area of a sufficient size can be secured for the side pad 61. A side pad insulating portion 110 having an insulating distance G is formed between a distal end 23b of a metal base 23 and a rear surface 101 of the side pad member 100. When a conductive bonding material (solder) is supplied to the side pad 61, if a part of the conductive bonding material adheres to the metal base 23, a "solder bridge" may occur. Occurrence of a "solder bridge" as in the above case can be suppressed by the side pad insulating portion 110 having the insulating distance G. Since the other structures have commonality with the terminal portion 50A shown in FIG. 9, common reference numbers are assigned to parts that are common to the two and explanations of such parts will be omitted.

FIG. 20 illustrates a terminal portion 50H according to a twelfth embodiment. An opening 43b is formed in a cover layer 43 in the vicinity of a side pad member 100. An upper pad 62 is formed inside the opening 43b. The upper pad 62 is covered with a gold-plated layer 60a. Since the other structures have commonality with the terminal portion 50G shown in FIG. 19, common reference numbers are assigned to parts that are common to the two and explanations of such parts will be omitted.

FIG. 21 illustrates a terminal portion 50J according to a thirteenth embodiment. The terminal portion 50J includes an insulating layer 40, a conductor 41, an intermediate insulating layer 80, a side pad member 100, a via portion 81, and a cover layer 43. The side pad member 100 is arranged on a surface 41a at an end portion of the conductor 41. The via portion 81 penetrates the intermediate insulating layer 80 in the thickness direction. An end face of the conductor 41 and the side pad member 100 are covered with a gold-plated layer 60. The side pad member 100 and the via portion 81 are made of the same metal (for example, nickel). A thickness M2 of the side pad member 100 is greater than a thickness T1 (for example, 10 µm) of the conductor 41. A side pad 61 is formed at a distal end side of the conductor 41. A length M3 of the side pad 61 is not less than double the thickness T1 of the conductor 41. A side pad insulating portion 110 having an insulating distance G is formed between a distal end 23b of a metal base 23 and a rear surface 101 of the side pad member 100. It is possible to prevent a conductive bonding material (solder) which is supplied to the side pad 61 from adhering to the metal base 23 by the side pad insulating portion 110. The strength of the terminal portion 50J can be improved by the via portion 81.

Figure 22:
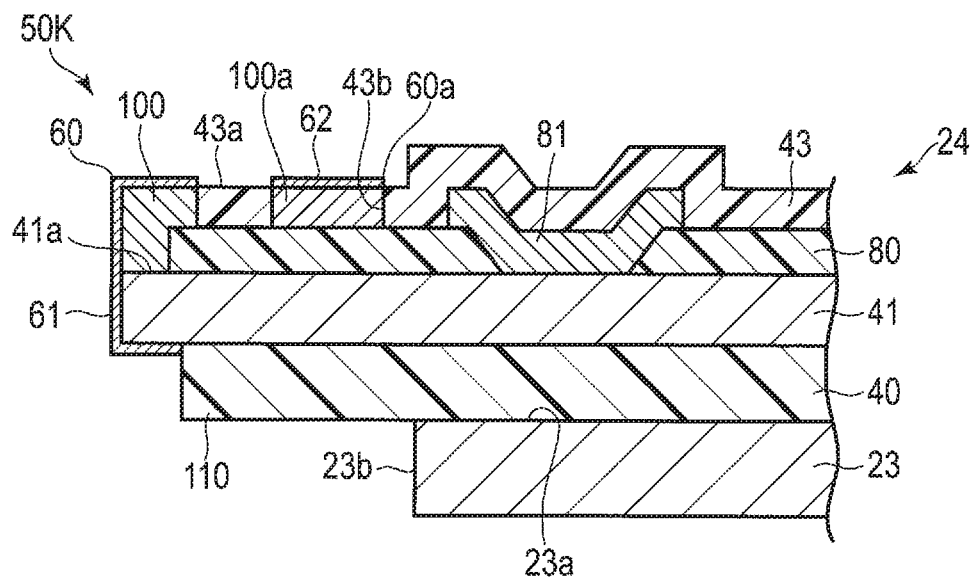
FIG. 22 is a cross-sectional view of a terminal portion according to a fourteenth embodiment.

FIG. 22 illustrates a terminal portion 50K according to a fourteenth embodiment. An opening 43b is formed in a cover layer 43 in the vicinity of a side pad member 100. A conductor 100a is formed inside the opening 43b. The conductor 100a is made of the same metal as that used for the side pad member 100. A via portion 81 is also made of the same metal as that used for the side pad member 100. An upper pad 62 is formed by the conductor 100a arranged inside the opening 43b. A surface of the upper pad 62 is covered with a gold-plated layer 60a. Since the other structures have commonality with the terminal portion 50J shown in FIG. 21, common reference numbers are assigned to parts that are common to the two and explanations of such parts will be omitted.

Figure 23:
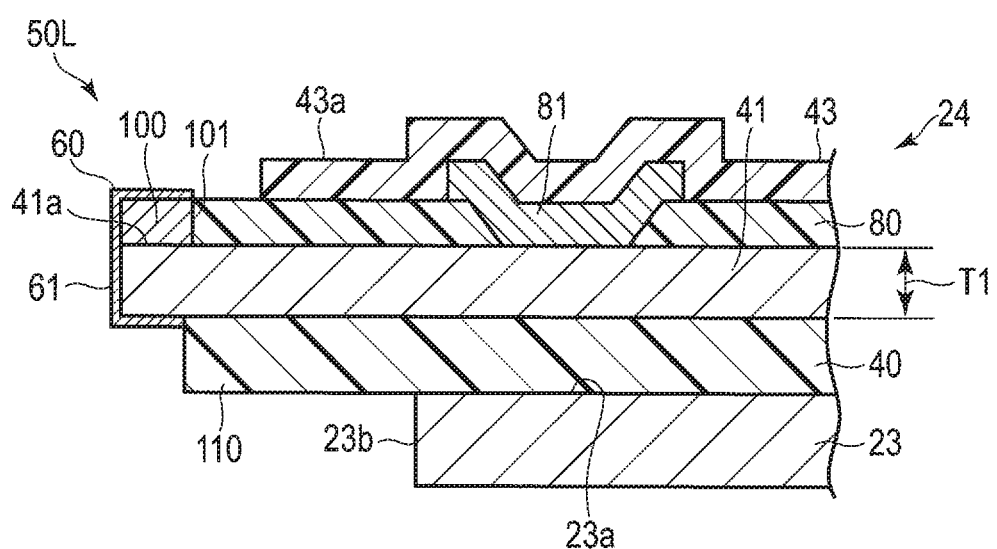
FIG. 23 is a cross-sectional view of a terminal portion according to a fifteenth embodiment.

FIG. 23 illustrates a terminal portion 50L according to a fifteenth embodiment. The terminal portion 50L includes a side pad insulating portion 110, a conductor 41, an intermediate insulating layer 80, a via portion 81, a cover layer 43, and a side pad member 100. The side pad insulating portion 110 is formed at a distal end side of an insulating layer 40. The via portion 81 penetrates the intermediate insulating layer 80 in the thickness direction. The side pad member 100 is disposed on a surface 41a at an end portion of the conductor 41. The via portion 81 and the side pad member 100 are made of nickel, for example. An end face of the conductor 41 and the side pad member 100 axe covered with a gold-plated layer 60. A side pad 61 of the terminal portion 50L extends in a thickness direction of the conductor 41 and the side pad member 100. Accordingly, a large connection area can be secured. Since the other structures have commonality with the terminal portion 50J shown in FIG. 21, common reference numbers are assigned to parts that are common to the two and explanations of such parts will be omitted.

FIG. 24 illustrates a terminal portion 50M according to a sixteenth embodiment. An opening 43b is formed in a cover layer 43 in the vicinity of a side pad 61. A conductor 100a which is integral with a side pad member 100 is provided inside the opening 43b. An upper pad 62 is formed by the conductor 100a. A surface of the conductor 100a is covered with a gold-plated layer 60a. Since the other structures have commonality with the terminal portion 50L shown in FIG. 23, common reference numbers are assigned to parts that are common to the two and explanations of such parts will be omitted.

FIG. 25 illustrates a terminal portion 50N according to a seventeenth embodiment. The terminal portion 50N includes a side pad insulating portion 110, a conductor 41, an intermediate insulating layer 80, a via portion 81, a cover layer 43, a side pad member 100, and a conductor 81a. The side pad insulating portion 110 is formed at a distal end side of an insulating layer 40. The via portion 81 penetrates the intermediate insulating layer 80 in the thickness direction. The side pad member 100 is electrically connected to the conductor 41. The conductor 81a is made of the same metal as that used for the via portion 81. The side pad member 100 is covered with a gold-plated layer 60. The side pad member 100 and the via portion 81 are made of nickel, for example. The side pad member 100 extends in a thickness direction of the conductors 41 and 81a. A side pad 61 having a length T7 is formed at a distal end side of the conductor 41. Accordingly, a large connection area can also be secured for the terminal portion 50N of the present embodiment. Since the other structures have commonality with the terminal portion 50J shown in FIG. 21, common reference numbers are assigned to parts that are common to the two and explanations of such parts will be omitted.

Figure 26:
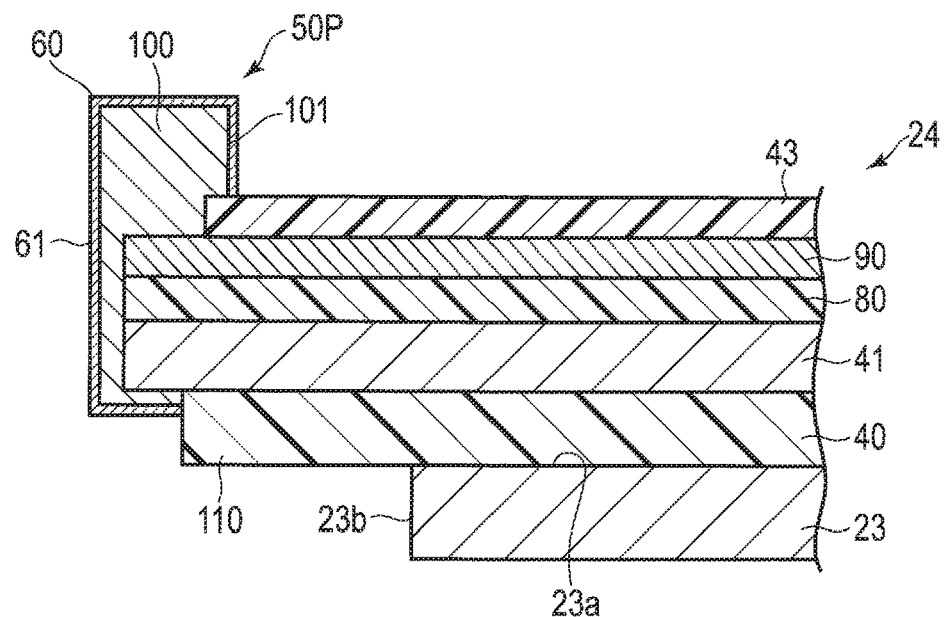
FIG. 26 is a cross-sectional view of a terminal portion according to an eighteenth embodiment.

FIG. 26 illustrates a terminal portion 50P according to an eighteenth embodiment. The terminal portion 50P includes a side pad insulating portion 110, a first conductor 41, an intermediate insulating layer 80, a second conductor 90, a cover layer 43, and a side pad member 100. The side pad insulating portion 110 is formed at a distal end side of an insulating layer 40. The side pad member 100 is covered with a gold-plated layer 60. The side pad member 100 extends in a thickness direction of the conductors 41 and 90. The first conductor 41 and the second conductor 90 are electrically short-circuited with each other via the side pad member 100. A side pad 61 is formed on a side surface of the side pad member 100.

In the terminal portion 50P shown in FIG. 26, the first conductor 41 and the second conductor 90 are stacked in the thickness direction with the intermediate insulating layer 80 interposed therebetween. Such a stacked structure can be applied to an interleaved circuit. With respect to the terminal portion 50P of the present embodiment, a distal end of the first conductor 41 and a distal end of the second conductor 90 are electrically short-circuited (electrically connected) with each other via the side pad portion 61 in the interleaved circuit. According to a short-circuit structure using the side pad 61, as compared to a case of short-circuiting a certain point in the middle of the conductors 41 and 90 in a longitudinal direction thereof via a via portion, the interleaved circuit can be made longer. Accordingly, the electrical properties can be improved. With respect to this point, a similar advantage can be expected in terminal portions 50Q, 50R, and 50S shown in FIGS. 27, 28, and 29, which will be described below.

Figure 27:
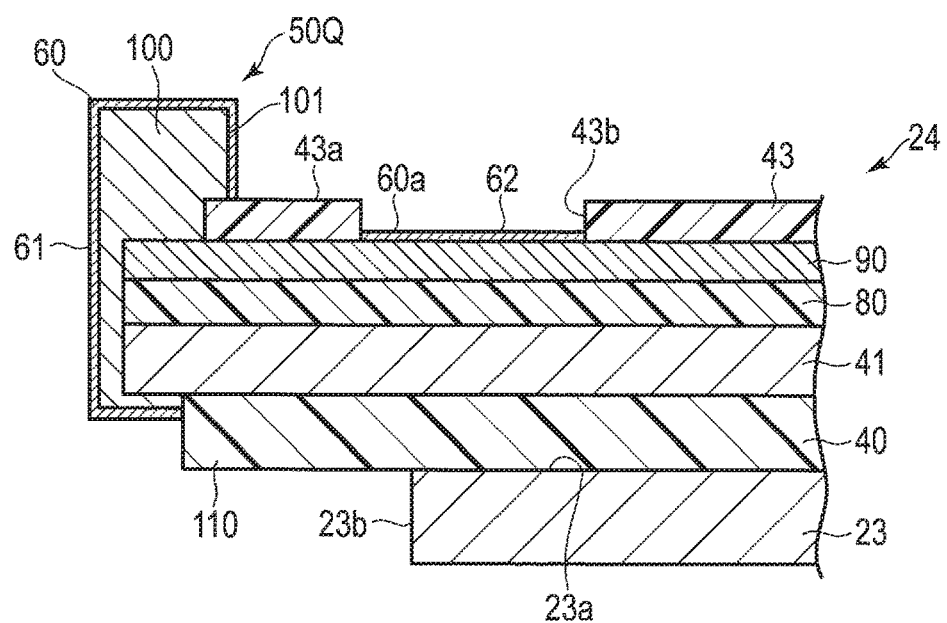
FIG. 27 is a cross-sectional view of a terminal portion according to a nineteenth embodiment.

FIG. 27 shows a terminal portion 50Q according to a nineteenth embodiment. An opening 43b is formed in a cover layer 43 in the vicinity of a side pad member 100. An upper pad 62 is formed inside the opening 43b. The upper pad 62 is covered with a gold-plated layer 60a. Accordingly, a side pad 61 can be connected to an electronic component or the upper pad 62 can be connected to the electronic component. Since the other structures have commonality with the terminal portion 50P shown in FIG. 26, common reference numbers are assigned to parts that are common to the two and explanations of such parts will be omitted.

Figure 28:
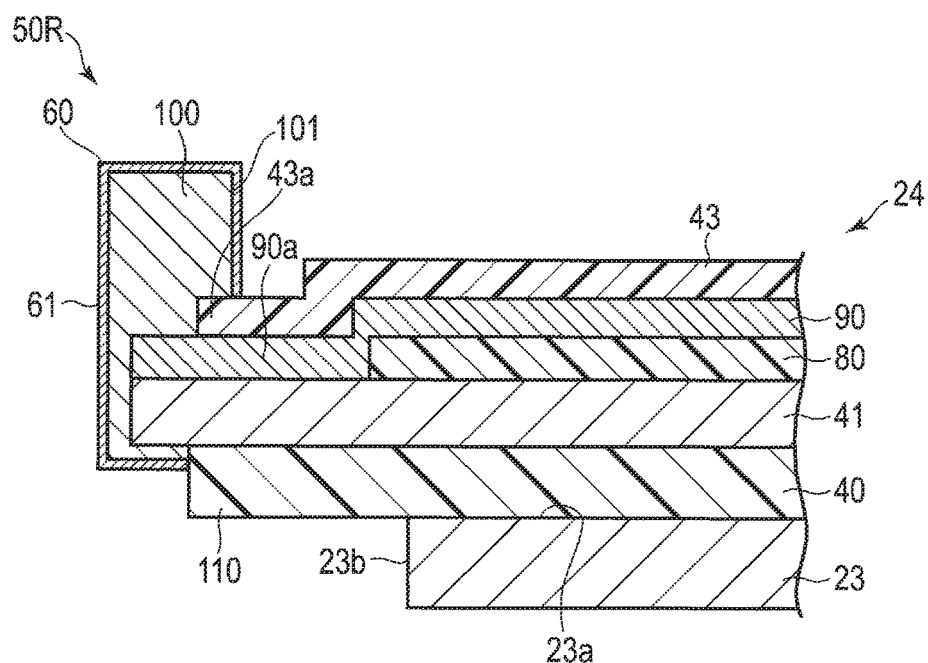
FIG. 28 is a cross-sectional view of a terminal portion according to a twentieth embodiment.

FIG. 28 illustrates a terminal portion 50R according to a twentieth embodiment. The terminal portion 50R is constituted of a side pad insulating portion 110, a first conductor 41, an intermediate insulating layer 80, an end portion 90a of a second conductor 90, a cover layer 43 including an extension portion 43a, a side pad member 100, etc. The side pad insulating portion 110 is formed at a distal end side of an insulating layer 40. The side pad member 100 is electrically connected to the first conductor 41 and the second conductor 90. A side pad 61 is formed on a side surface of the side pad member 100. The side pad member 100 is covered with a gold-plated layer 60. A large connection area can also be secured for the side pad 61 of the terminal portion 50R, and reliable electrical connection with an electronic component can be achieved.

Figure 29:
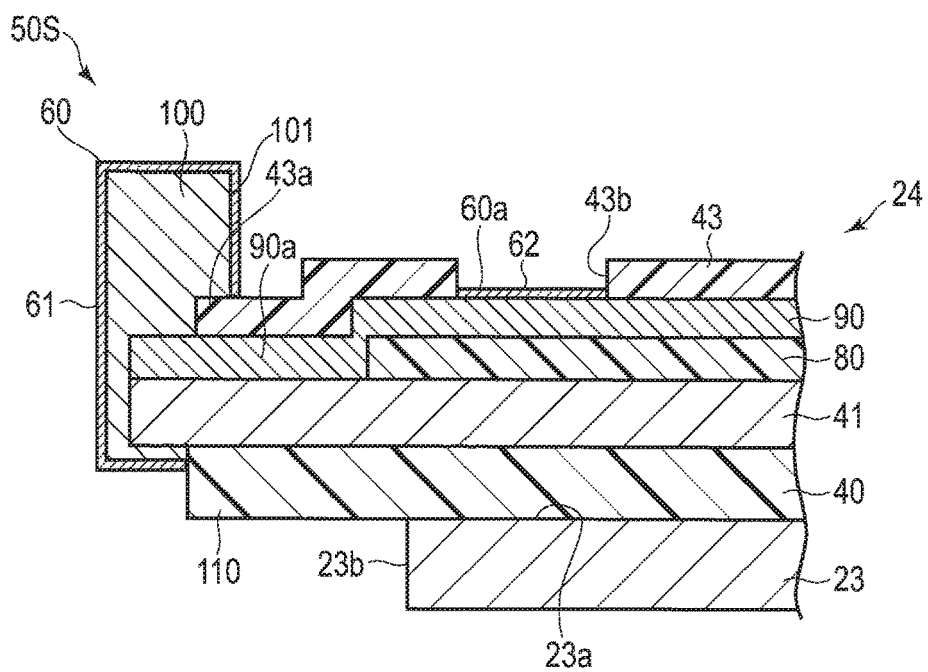
FIG. 29 is a cross-sectional view of a terminal portion according to a twenty-first embodiment.

FIG. 29 illustrates a terminal portion 50S according to a twenty-first embodiment. An opening 43b is formed in a cover layer 43 in the vicinity of a side pad member 100. An upper pad 62 is formed inside the opening 43b. The upper pad 62 is covered with a gold-plated layer 60a. Accordingly, a side pad 61 can be connected to an electronic component or the upper pad 62 can be connected to the electronic component. Since the other structures have commonality with the terminal portion 50R shown in FIG. 28, common reference numbers are assigned to parts that are common to the two and explanations of such parts will be omitted.

In carrying out the present invention, as well as the specific structure of a suspension including a conductive circuit portion, the shapes of the extension portion of the conductor, the insulating layer, the side pad portion, the side pad member, etc., which constitute the terminal portion of the conductive circuit portion may be modified variously as needed. Also, the type of an electronic component to be connected to the terminal portion is not limited.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A circuit member of a disk drive suspension comprising:
a metal base;
an insulating layer, which is made of an electrically insulating material, formed on the metal base;
a conductor formed on the insulating layer;
a cover layer, which is made of an electrically insulating material, covering the conductor; and
a terminal portion,
wherein the terminal portion comprises:
a thick portion formed on a side part of the insulating layer;
an extension portion of the conductor overlapping the thick portion;
a side pad portion, which is a part of the extension portion, and extends in a thickness direction of the conductor along a side surface of the thick portion; and
a side pad insulating portion, which is formed of a part of the thick portion, and electrically insulates a distal end of the metal base from the side pad portion.

2. The circuit member of claim 1, further comprising a side pad, which is covered with a gold-plated layer, on a side surface of the side pad portion.

3. The circuit member of claim 2, further comprising an opening formed in the cover layer, and an upper pad which is electrically connected to the conductor inside the opening.

4. The circuit member of claim 1, wherein the terminal portion comprises the thick portion, a first conductor overlapping the thick portion, an intermediate insulating layer overlapping the first conductor, a second conductor overlapping the intermediate insulating layer, and the side pad portion is electrically connected to the first conductor and the second conductor, and extends in a thickness direction of the first conductor and the second conductor.

5. The circuit member of claim 1, wherein the thick portion of the terminal portion includes step portions in which a height is stepwise reduced toward an outer side, and the side pad portion is formed in a stair-like configuration along the step portions.

6. A circuit member of a disk drive suspension comprising:
a metal base;
an insulating layer, which is made of an electrically insulating material, formed on the metal base;
a conductor formed on the insulating layer;

a cover layer, which is made of an electrically insulating material, covering the conductor; and a terminal portion, wherein the terminal portion comprises:

a side pad member which is disposed on a surface of an end portion of the conductor, and which extends in a thickness direction of the conductor; and a side pad insulating portion which is formed of a part of the insulating layer, and which is configured to electrically insulate a distal end of the metal base from the side pad member, the side pad insulating portion having an insulating distance between the distal end of the metal base and the side pad member with respect to a length direction along the surface of the end portion of the conductor whereby the metal base and the side pad member do not overlap.

7. The circuit member of claim 6, further comprising a side pad, which is covered with a gold-plated layer, on a side surface of the side pad member.

8. The circuit member of claim 7, wherein an opening is formed in the cover layer, and the circuit member comprises an upper pad which is electrically connected to the conductor inside the opening.

9. The circuit member of claim 6, wherein the terminal portion includes an intermediate insulating layer covering the conductor, and a via portion which penetrates the intermediate insulating layer in a thickness direction thereof, and is made of a same metal as the side pad member.

10. The circuit member of claim 6, wherein the terminal portion comprises the insulating layer, a first conductor overlapping the insulating layer, an intermediate insulating layer overlapping the first conductor, a second conductor overlapping the intermediate insulating layer, and the side pad member is electrically connected to the first conductor and the second conductor, and extends a thickness direction of the first conductor and the second conductor.

* * * * *